(12) United States Patent
Engelen et al.

(10) Patent No.: US 10,090,821 B2
(45) Date of Patent: Oct. 2, 2018

(54) MECHANICAL RESONATOR WITH A SPRING-MASS SYSTEM COMPRISING A PHASE-CHANGE MATERIAL

(71) Applicant: International Business Machines Corporation, Armonk, NY (US)

(72) Inventors: Johan B. C. Engelen, Zurich (CH); Mark A. Lantz, Adliswil (CH); Wabe W. Koelmans, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/441,409

(22) Filed: Feb. 24, 2017

(65) Prior Publication Data
US 2017/0163239 A1  Jun. 8, 2017

Related U.S. Application Data

(63) Continuation of application No. 14/686,509, filed on Apr. 14, 2015, now Pat. No. 9,584,092.

(51) Int. Cl.
*H03H 9/24* (2006.01)
*H03H 9/46* (2006.01)
(Continued)

(52) U.S. Cl.
CPC ......... *H03H 9/02393* (2013.01); *B81B 3/007* (2013.01); *B81B 3/0045* (2013.01);
(Continued)

(58) Field of Classification Search
CPC .......... H03H 9/02393; H03H 9/02401; H03H 9/02409; H03H 9/02244; H03H 9/02259;
(Continued)

(56) References Cited

U.S. PATENT DOCUMENTS

| 6,169,321 B1 | 1/2001 | Nguyen |
| 6,847,271 B2 * | 1/2005 | Korden ................... H03H 3/04 310/311 |

(Continued)

FOREIGN PATENT DOCUMENTS

| EP | 1743421 | 4/2009 |
| WO | WO2015161257 A1 | 10/2015 |
| WO | WO2016151317 A1 | 9/2016 |

OTHER PUBLICATIONS

AVSS Prasad et al. Electro thermally tunable MEMS filters. Proc. of SPIE vol. 8975 downloaded from http://proceedings.spiedigitallibrary.org/ on Mar. 19, 2014, pp. 1-8.
(Continued)

*Primary Examiner* — Barbara Summons
(74) *Attorney, Agent, or Firm* — Daniel P. Morris; Otterstedt, Ellenbogen & Kammer, LLP

(57) ABSTRACT

A mechanical resonator includes a spring-mass system, wherein the spring-mass system comprises a phase-change material. The mechanical resonator typically comprises an electrical circuit portion, coupled to the phase-change material to alter a phase configuration within the phase-change material. Methods of operation are also disclosed.

3 Claims, 5 Drawing Sheets

(51) Int. Cl.
  *B81B 3/00* (2006.01)
  *B81B 7/00* (2006.01)
  *H03H 9/02* (2006.01)
(52) U.S. Cl.
  CPC ......... *B81B 7/008* (2013.01); *H03H 9/02244* (2013.01); *H03H 2009/02165* (2013.01); *H03H 2009/02299* (2013.01); *H03H 2009/02322* (2013.01)
(58) Field of Classification Search
  CPC ........... H03H 9/02275; H03H 9/02338; H03H 9/02362; H03H 9/02377; H03H 2009/02165; H03H 2009/02551; H03H 2009/02283; H03H 2009/02291; H03H 2009/02299; H03H 2009/02307; H03H 2009/02322; B81B 3/0045; B81B 3/0035; B81B 3/007; B81B 3/0072; B81B 3/0086; B81B 3/0094; B81B 3/0097; B81B 7/008; B81B 7/0083; B81B 7/0087; B81B 2203/0109; B81B 2203/0118; B81B 2203/0136; B81B 2203/0145; B81B 2203/0163; H02N 11/00
  USPC .................................................. 333/186, 188
  See application file for complete search history.

(56) References Cited

U.S. PATENT DOCUMENTS

| | | | |
|---|---|---|---|
| 7,068,126 | B2 | 6/2006 | Huang et al. |
| 7,095,295 | B1 | 8/2006 | Stafford et al. |
| 7,522,029 | B1 | 4/2009 | Lantz |
| 7,551,044 | B2 | 6/2009 | Naito |
| 8,044,750 | B2 | 10/2011 | Jun |
| 8,106,723 | B2 | 1/2012 | Watanabe |
| 8,115,573 | B2 | 2/2012 | Schoen et al. |
| 9,584,092 | B2 * | 2/2017 | Engelen ................. H02N 11/00 |
| 9,887,685 | B2 * | 2/2018 | Engelen et al. ... H03H 9/02393 |
| 2004/0027646 | A1 | 2/2004 | Miller |
| 2010/0238720 | A1 | 9/2010 | Tio Castro |
| 2011/0038093 | A1 | 2/2011 | Furukawa |
| 2013/0307644 | A1 | 11/2013 | Yonak |
| 2014/0009249 | A1 | 1/2014 | Park |
| 2014/0266300 | A1 | 9/2014 | Sherwin |
| 2016/0308470 | A1 | 10/2016 | Engelen |
| 2016/0308507 | A1 | 10/2016 | Engelen |

OTHER PUBLICATIONS

Svilicic, B et al. Electro thermally actuated and piezoelectrically sensed silicon carbide tunable MEMS resonator. Electron Device Letters, IEEE (vol. 33, Issue: 2). pp. 278-280, Date of Publication: Jan. 9, 2012.
Il-Mok Park et al. Thermomechanical properties and mechanical stresses of Ge2Sb2Te5 films in phase-change random access memory. Thin Solid Films 517 (2008) p. 848-852.
Enrico Mastropaolo et al, Electrothermally Actuated Silicon Carbide Tunable MEMS Resonators. Journal of Microelectromechanical Systems, vol. 21, No. 4, Aug. 2012 p. 811-821.
Barry E. DeMartini et al, Linear and Nonlinear Tuning of Parametrically Excited MEMS Oscillators. Journal of Microelectromechanical Systems, vol. 16, No. 2, Apr. 2007, p. 310-318.
Weiguan Zhang et al. Frequency Tuning in a MEMS Resonator via an Integral Crossbar Heater. Procedia Engineering 47 (2012) p. 949-952.
Wen-Chien Chen et al. High-Q Integrated CMOS-MEMS Resonators With Deep-Submicrometer Gaps and Quasi-Linear Frequency Tuning. Journal of Microelectromechanical Systems, vol. 21, No. 3, Jun. 2012 p. 688-701.
E. Merced et al.; "Frequency Tuning of V02-Coated Buckled Microbridges"; JM EMS Letters, Journal of Microelectromechanical Systems, vol. 20, No. 3, Jun. 2011, pp. 558-560.
N. Sepulveda et al.; "Resonant Frequency Behavior of Silicon Cantilevers Coated With Nanostructured and Microcrystalline V02 Films"; Research Letters, IEEE Transactions on Nanotechnology, vol. 9, No. 3, May 2010, pp. 330-334.
G. Hummel et al.; "Phase Change Material Programmable Vias for Switching and Reconfiguration of Aluminum Nitride Piezoelectric MEMS Resonators"; 2014 IEEE International Frequency Control Symposium (FCS), pp. 1-3 and 1 page IEEE Xplore Abstract, Date of Conference May 19-22, 2014.
Puzzilli et al.; "On the Reset-Set Transition in Phase Change Memories"; published in ESSDERC 2008: The 38th European Solid-State Device Research Conference 2008, pp. 158-161, date of conference Sep. 15-19, 2008, publisher IEEE, added to IEEE Xplore on Nov. 18, 2008.
List of IBM Patents or Patent Applications Treated as Related, Feb. 24, 2017, pp. 1-2.
N. Manca et al.; "Programmable Mechanical Resonances in MEMS by Localized Joule Heating of Phase Change Materials"; Advanced Materials vol. 25, Issue 44, Nov. 26, 2013, pp. 6430-6435, first published Aug. 27, 2013, and 1 page Wiley on line library abstract showing the publication dates.
P. Hosseini et al.; "2-D Materials as a Functional Platform for Phase Change Tunable NEMS"; IEEE Access The journal for rapid open access publishing, vol. 3, Jun. 10, 2015 p. 737-742.

* cited by examiner

US 10,090,821 B2

MECHANICAL RESONATOR WITH A SPRING-MASS SYSTEM COMPRISING A PHASE-CHANGE MATERIAL

CROSS REFERENCE TO RELATED APPLICATIONS

The present application is a continuation of U.S. patent application Ser. No. 14/686,509 filed Apr. 14, 2015 and entitled "MECHANICAL RESONATOR WITH A SPRING-MASS SYSTEM COMPRISING A PHASE-CHANGE MATERIAL", which is hereby incorporated herein by reference in its entirety for all purposes.

BACKGROUND

The invention relates in general to the field of mechanical resonators (that comprise a spring-mass system) and methods of operation thereof.

One knows tunable microelectromechanical resonators. Microelectromechanical resonators are used in clock generators and electronic filters. Fabrication tolerances of the microelectromechanical devices can result in resonance frequency tolerances that need to be corrected, or tuned. In addition, for some applications the frequency of the resonator may need to be tunable. Moreover, if the tunable resonator provides a large enough tuning range, it can replace a bank of fixed resonators.

SUMMARY

According to a first aspect, the present invention is embodied as a mechanical resonator, comprising a spring-mass system, wherein the spring-mass system comprises a phase-change material. The mechanical resonator may typically comprises an electrical circuit portion, coupled to the phase-change material to alter a phase configuration within the phase-change material.

According to another aspect, the invention is embodied as a method for tuning a resonance frequency of a spring-mass system of a mechanical resonator according to the invention. Basically, the method comprises: altering a phase configuration of the phase-change material to tune the resonance frequency to a desired value.

Devices, apparatuses, and methods embodying the present invention will now be described, by way of non-limiting examples, and in reference to the accompanying drawings. Technical features depicted in the drawings are not necessarily to scale.

DETAILED DESCRIPTION

In reference to FIGS. 1-9, an aspect of the invention is first described, which concerns a mechanical resonator 1, 1a. The resonator comprises a spring-mass system 15, 20, which spring-mass system comprises a phase-change material 10.

As present inventors have realized, using a phase-change material (or PCM for short) in such a resonator can advantageously be used to tune the resonance frequency of the resonator, by altering the material structure (e.g., a phase configuration within the PCM and, in particular, a [non-] crystalline state of the PCM).

"Phase configuration" means that one (or more) phase(s), e.g., crystalline, micro- or nano-crystalline, poly-crystalline, amorphous, etc., may exist (or coexist), which can be altered by an appropriate stimulus. This, in turn, results in changing the resonance frequency of the resonator. Interestingly, the resonance frequency of a PCM can be tuned to a stable frequency, without additional energy being required to maintain the tuned frequency in a stable state. In addition, the range in which the frequency can be tuned happens to be at least an order of magnitude larger than with known methods.

By contrast, in the prior art methods, the tunability of the frequency is achieved through one of the following methods:
  One may modify a force-gradient over a motion range of mechanical part, e.g. through electrostatic or magnetic force;
  By heating of, e.g., a silicon spring element and making use of the (negative) temperature dependence of the elastic modulus of silicon; and
  Employ the resonator in a resonating electrical circuit with tunable electrical components (e.g., capacitors).

All these solutions require active tuning that costs energy continuously. Common tuning ranges are 1% or less, whereas the present solution typically allows ranges of at least 10%.

Figure 4:
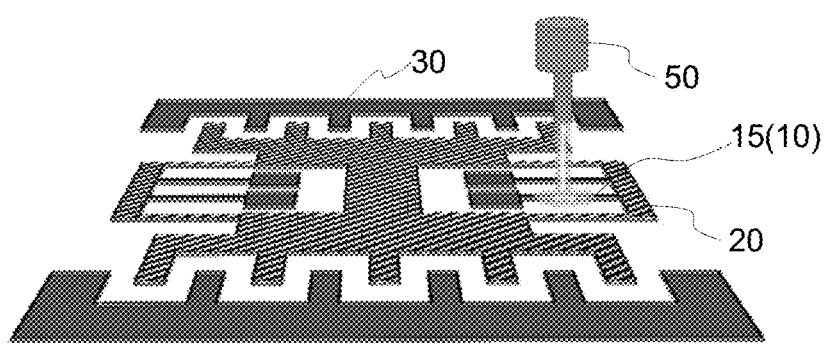
FIG. 4 is a perspective view of a device as in FIG. 1, further including a Laser to alter a phase configuration within the phase change material of the device, as in embodiments.
Figure 5:
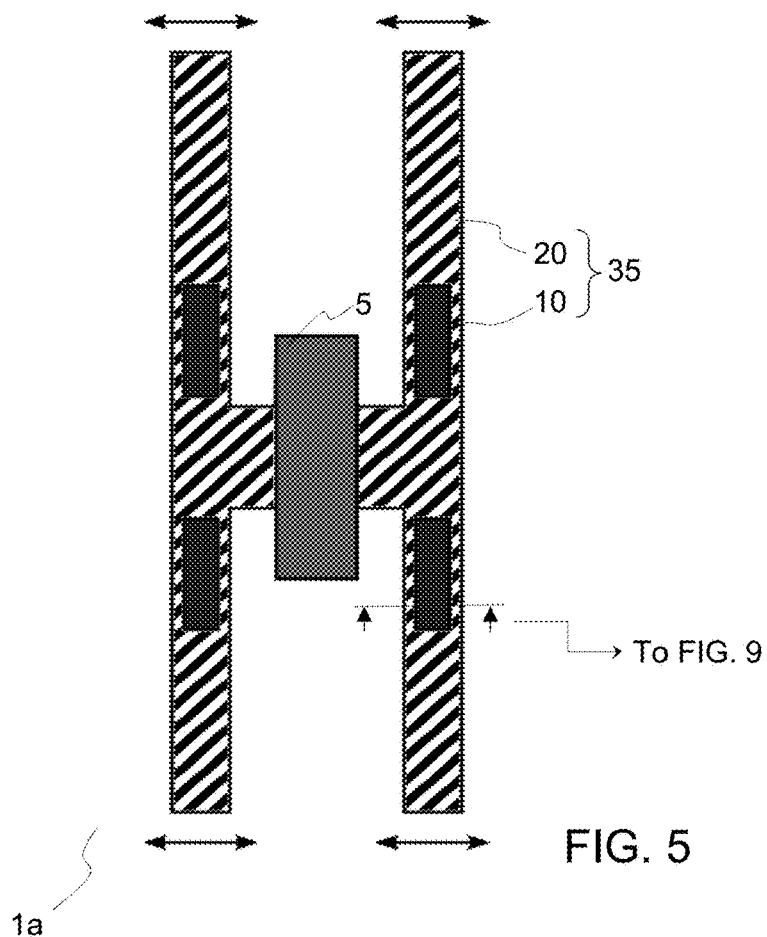
FIGS. 5 and 6 are top views of simplified representations of a mechanical resonator, whose spring-mass system has a spring-mass part, which comprises the phase change material, as involved in embodiments.
Figure 6:
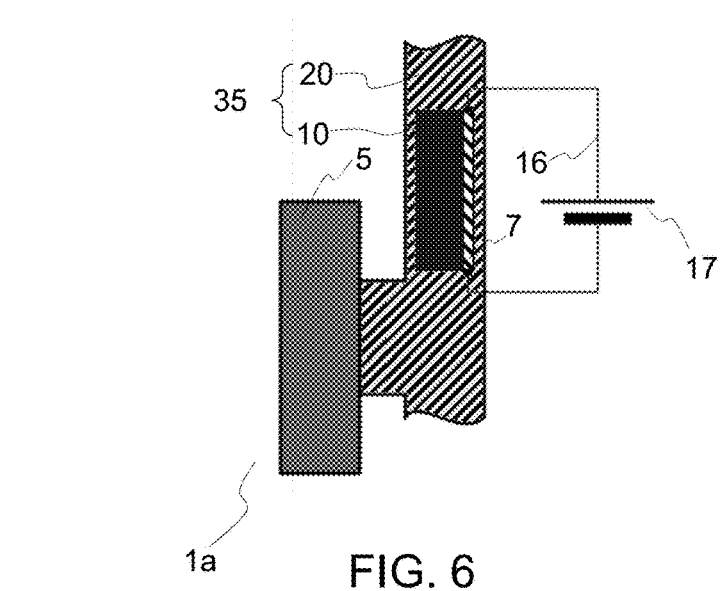

A spring-mass system is known per se: it generally consists of a mass coupled to a spring, so as to convert energy, back and forth, from kinetic energy to potential energy. In the embodiments of FIGS. 1-4, the mass and spring are distinct parts. However, there is no need for the mass and spring to be distinct parts in the present context. The mass and spring may instead belong to a same part (one-piece or integral), as in cantilevers, where the cantilever acts as both a spring and a mass, as illustrated in FIGS. 5-6. Still, in practice, the spring shall often have a mass or disk design, or a mushroom resonators' design.

In the embodiments of FIGS. 1-4, numeral references 15 and 20 refer to the spring and the moving mass, respectively, while reference 5 refers to anchors (to the fixed mechanical ground). The spring-mass system 15, 20 comprises: a movable mass 20; and a spring part 15. The spring part 15 comprises the PCM 10. The movable mass 20 is connected to fixed parts of the resonator, via the spring part 15. The anchors 5 are not moving and therefore are not part of the moving mass, and they are accordingly not considered to be part of the spring-mass system 15, 20.

Reference 30 denotes a fixed comb. Each of the two fixed combs 30 forms an electrode arrangement, and is opposing a movable comb that forms part of the movable mass 20, to form associated electrode arrangements, wherein the fixed fingers of the fixed combs 30 interleave movable fingers of the combs of the moving mass 20. Two electrode pairs are used: one pair comprising the bottom fixed comb and the top movable comb, and the other pair comprising the top fixed comb and the bottom movable comb. These two electrode pairs form an input and an output of the resonator, as known per se. Since the structure is symmetric, the input and output can be interchanged. To actuate the resonator, a combination of AC and DC voltages can be applied to the input electrode, to cause the movable mass 20 to vibrate, as known per se.

The mechanical resonators 1, 1*a* described herein are typically used in microelectromechanical systems (MEMS) or in nanoelectromechanical systems (NEMS), and are thus typically embodied as a MEMS or NEMS resonator.

The spring-mass concept used by the invention is now discussed in more details. Resonators such as described herein can be regarded as a spring-mass system, where the spring is converting energy back and forth from kinetic to potential energy. The resonance frequency $f_r$ of the resonator depends on the elastic modulus E of the spring material (through the effective spring stiffness k), according to: $f_r \propto \sqrt{k} \propto \sqrt{E}$. The elastic modulus (or 'stiffness') of the PCM depends on its phase configuration. E.g., it is different for the crystalline and amorphous phases. If one can control the elastic modulus, one can control the resonance frequency. Because the elastic modulus changes substantially (if not dramatically) between two distinct phases of the PCM, a large tuning range can be achieved. It can be verified that the elastic modulus E may change by almost a factor of two for GST materials (see below), resulting in a potential 40% frequency tuning range. Once tuned, the resonance frequency is stable with the present solution, whereas the prior art solutions provide tuning ranges that are typically below 1% and consume power continuously to maintain the desired frequency tuning. As discussed below in details, the PCM's phase configuration can be altered electrically (by Joule heating), by passing a current through the phase-change material itself or through a separate heating element. In variants, one may apply laser pulses to locally heat the PCM. By altering the phase, e.g., changing the ratio between the crystalline and amorphous volumes of the PCM, the elastic modulus can be tuned to the desired, stable value. The skilled person shall appreciate that embodiments of the present invention may be applied to various mechanical resonator designs.

Referring now more specifically to FIGS. 2-4, and 6: in embodiments, the mechanical resonator may further comprise an electrical circuit portion 7, 16, 17, suitably coupled to the PCM 10, so as to allow a material structure (the phase configuration) of the PCM to be altered. Altering the phase configuration results in altering the arrangement of atoms, ions or molecules forming the PCM, which arrangement can form a more or less ordered structure (ranging from a perfect crystal to an amorphous phase), or multiple sub-volumes having a more or less ordered structure.

Figure 2:
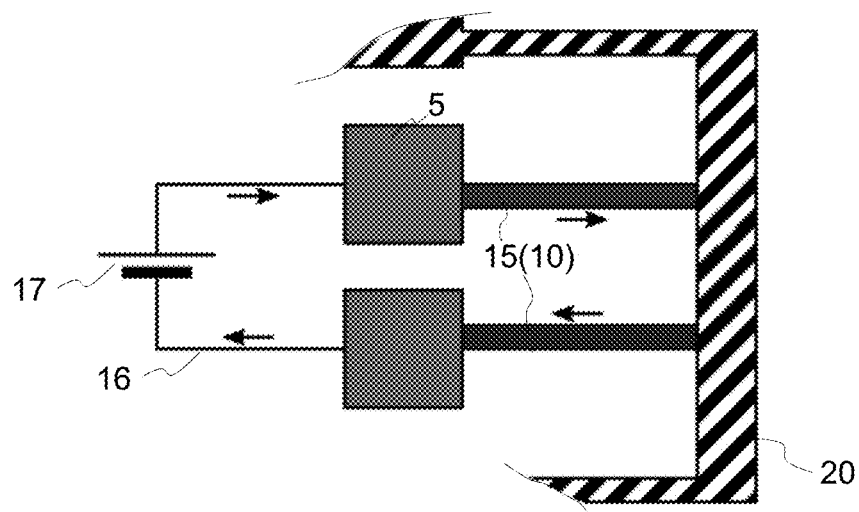
FIGS. 2 and 3 are top views, focusing on portions of variants to the device of FIG. 1, as involved in embodiments.
Figure 3:
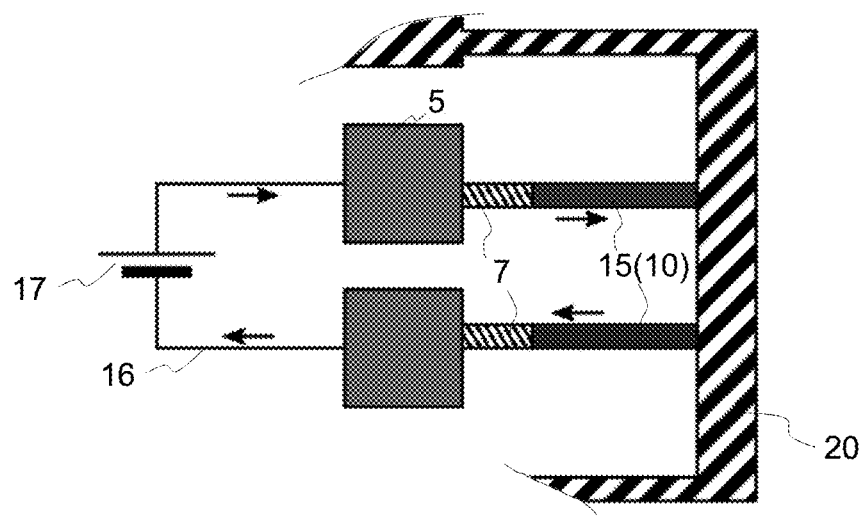

As illustrated in FIGS. 2-3 and 6, the electrical circuit portion can be electrically or thermally coupled to the PCM, by means of a heating element 7, to the PCM. Circuit designs can even be contemplated, where an electrical circuit portion is both electrically and thermally coupled to the PCM, as illustrated in FIG. 3, where the heating elements 7 are coupled, each, to a spring part 15 of the spring-mass system, in series.

In fact, any suitable form of energy that can be supplied to the PCM can be contemplated, in order to facilitate changes in the phase configuration. As discussed later in detail in reference to FIG. 4, a Laser 50 may also be employed.

Referring now specifically to FIG. 2: in embodiments, the electrical circuit portion 16 of the mechanical resonator 1 may electrically connect to the PCM 10 (e.g., via anchors 5, serving also as electrodes in this case), such that the phase configuration of the PCM can be altered by Joule heating, i.e., by supplying electric current to the PCM via the electrical circuit 16, 17.

Preferably, a PCM material is selected, which enables reversibly transformable phases. The reversibly transformable phases may for instance consist of at least two distinct phases (in the sense that the elastic modulus is discernibly different, being e.g., a crystalline and an amorphous phase). In a strict sense, the phase configuration may be defined by a ratio, i.e., the relative fraction of the material size/volume that is in a crystalline or polycrystalline phase and the relative fraction of the material size/volume that is in an amorphous phase. But more generally, any change in the phase configuration may affect the resonance frequency, a phenomenon that is exploited here to tune the resonance frequency.

A change in the phase configuration may for instance lead to or remove crystalline areas/volumes within amorphous areas/volumes. Thus, a variety of phase configurations (e.g., multiple crystalline volumes, a single crystalline volume, multiple amorphous volumes and a single amorphous volume) may be obtained and observed simultaneously in the PCM, in varying proportions and with varying geometry. Altering the phase configuration allows to change the resonance frequency.

Referring now more specifically to FIGS. 3, 6: in embodiments, the electrical circuit portion 16 comprises a heating element 7, arranged in thermal communication with the PCM 10. A phase configuration of the PCM can here be altered by supplying electric current to the heating element 7, via the electric circuit portion 16, to heat the PCM 10.

In the embodiment of FIG. 3, the heating element 7 and the PCM 10 are in series, such that current passes through both of them to be able to provide sufficient heating power when the PCM is in a low-resistance state. Indeed, in a crystalline state, the resistance of the PCM is low and it is thus more difficult to generate enough Joule heating inside the PCM, it being reminded that the heating power shall be proportional to current times voltage.

For instance, in a PCM memory, there is a resistor in series with the PCM, which, as it can be realized, may also act as a heating element. If the PCM has a very low resistance, this series resistor may have a high enough resistance to generate sufficient heat to change the phase of the PCM.

In the embodiment of FIG. 6, the heating element 7 (e.g., a resistance) is arranged contiguous to the PCM; current passes through the heating element only in that case. The heating element 7 is in thermal contact with the PCM 10, such that a phase configuration of the PCM 10 can be altered by supplying electric current to the heating element 7 via the electric circuit portion 16, to heat the PCM 10.

As opposed to the embodiments of FIGS. 1-4, alternate resonator designs can be contemplated wherein mass and springs are not distinct parts but are on the contrary one-piece (or integral), e.g., in a cantilever or disk mushroom resonator design. In that respect, the variants depicted in FIGS. 5 and 6 illustrate mechanical resonators 1*a*, wherein the spring-mass system comprises a spring-mass part 35, which comprises the PCM 10 as well as the mass 20. Here the spring-mass part 35 is an integral part, wherein the spring-mass part 35 is connected to a fixed part 5 of the resonator.

Figure 1:
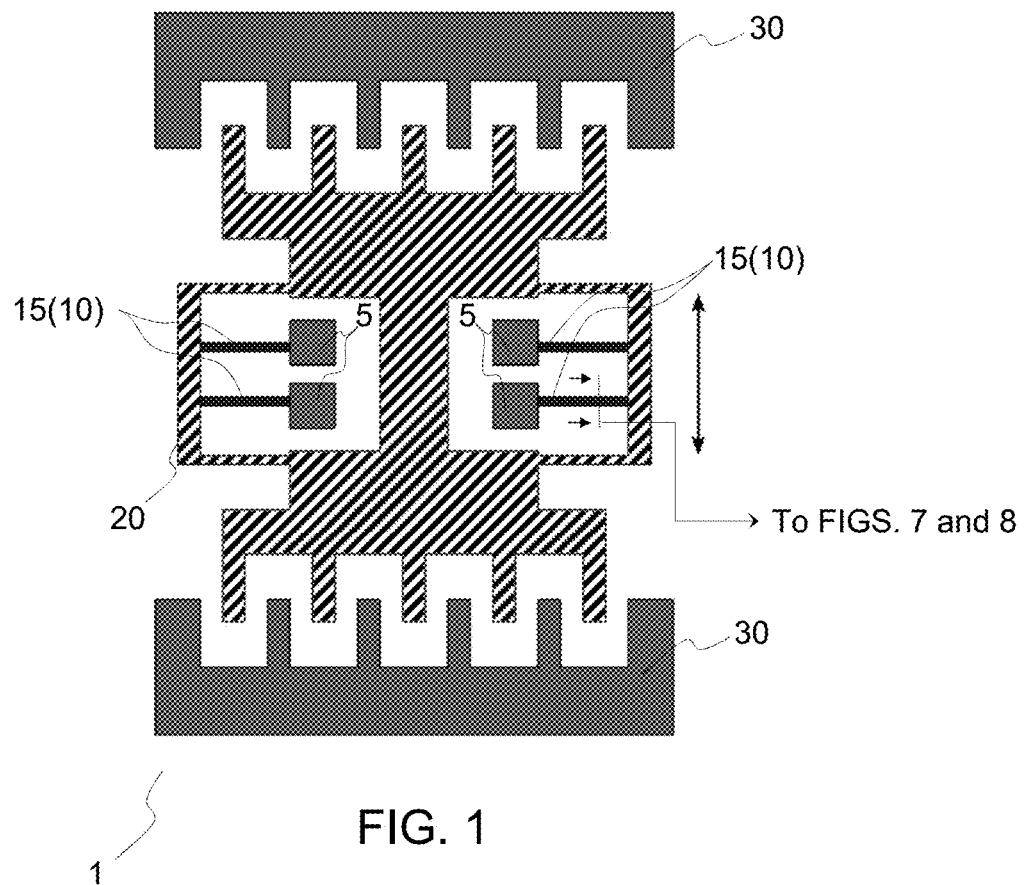
FIG. 1 is a top view of a simplified representation of a mechanical resonator, having a spring-mass system which comprises a phase change material, according to embodiments.

In embodiments, the PCM may comprise a material that is one of the following: $Ge_2Sb_2Te_5$ (or GST); GeTe; AgInSbTe; SnTe; and Sb. GST, if used, may be doped with, e.g., $SiO_2$. Furthermore, combinations of two or more of the above material may be contemplated. The PCM may else comprise one or more elements from the group of chalcogenides (e.g., sulfur, selenium and tellurium). As the one skilled in the art may appreciate, many combinations can be contemplated. More generally, present devices may use two, or more, PCMs (as illustrated in e.g., FIG. 5). Each PCM may be connected by a respective electrical circuit, in embodiments. In variants, two or more of the PCMs may be connected by a same electrical circuit. For instance, the embodiment of FIG. 5 may typically involve one, two or four electrical circuit(s) to connect each of the four PCMs. In FIG. 1, two electrical circuits are involved, which connect the right-hand side fixed parts 5 and the left-hand side fixed parts 5, respectively.

The PCM may be chosen such that its phase configuration can be altered so as to change the resonance frequency of the spring-mass system by up to (or at least) 10%, and preferably by up to (or at least) 20%. In principle, up to 40% frequency range tuning can theoretically be observed, e.g., with GST materials. More generally, the present frequency ranges will outperform the prior art, where the typical frequency range tuning range is of 1%.

The present invention can further be embodied as an apparatus comprising one or more mechanical resonators such as described above. Referring to FIG. 4, such an apparatus may for instance comprise a Laser 50, configured in the apparatus for altering the phase configuration of the PCM 10 of the mechanical resonator. In variants, the Laser is not to be included in the apparatus. Rather, a Laser is used during or after the process of fabrication of the resonator (or of the apparatus comprising such a resonator), such that an apparatus that has been shipped does not need to include the Laser for tuning the resonance frequency.

More generally (and referring to FIGS. 2-4 and 6), the invention may be embodied as an electronic device 1, 1a that comprises a mechanical resonator such as described above. This device may for instance be a clock generator or an electronic filter. This device shall preferably comprise means 7, 16, 17, 50 for altering a phase configuration of the PCM, with said means comprising a power supply 17 to supply electric energy to the electrical circuit portion 16 that is coupled to the PCM, in order to electrically alter a phase configuration of the PCM, as explained earlier.

In embodiments, the mechanical resonator (or a device or apparatus that comprises it) may further comprise a fine-tuning mechanism, which can be operated distinctly from said means for altering the phase configuration of the PCM, for fine tuning a resonance frequency of the spring. Examples of fine-tuning mechanisms are mechanisms allowing for modifying force-gradient over the motion range of the spring-mass system, e.g., through electrostatic or magnetic forces. The fine tuning mechanism may otherwise involve a heater configured in the device for slightly changing the temperature (but not the phase, or at least not substantially) of the spring-mass system. The fine tuning mechanism may, for instance, make use of and possibly compensating for the temperature dependence of the elastic modulus of the spring-mass system. In variants, one may also place the resonator in a larger circuit and tune the frequency of this larger circuit. Although the fine-tuning mechanism should be able to be operated distinctly from the means for altering the phase configuration of the PCM, they do not necessarily need to be fully distinct from the means used to alter the phase configuration of the PCM. For example, the same circuit 7, 16, 17 (FIGS. 2, 3, 6) that is used for thermally altering the PCM phase could be re-used, but with distinct electrical currents, e.g., to cause a lower temperature change to the PCM (to fine-tune the frequency), but such that the PCM phase does not change substantially.

Figure 7:
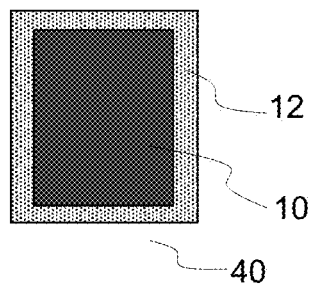
FIGS. 7-9 are 2D cross-sectional views of parts of the devices of FIGS. 1 and 5, FIGS. 7 and 8 showing two possible variants, and according to embodiments.
Figure 8:
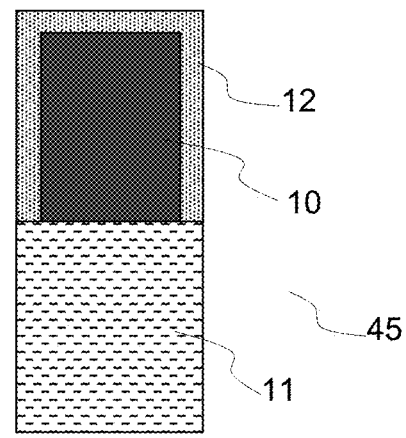
Figure 9:
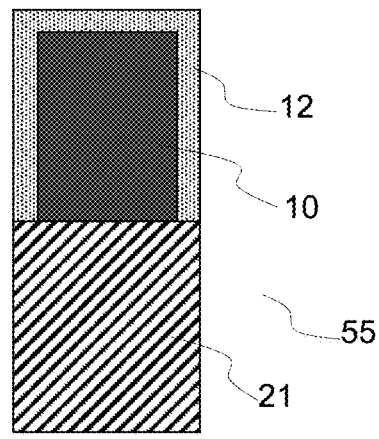
Figure 10:
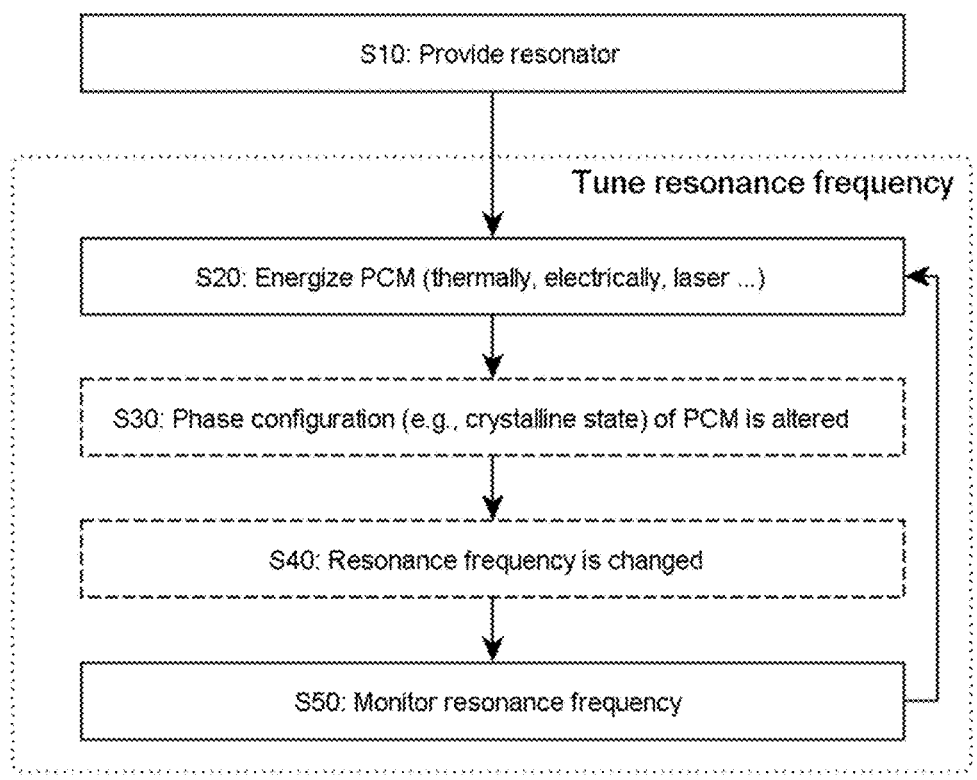
FIG. 10 is a flowchart illustrating high-level steps of a method of operating a device according to embodiments.

Next, referring to FIG. 7, 8, or 9, the mechanical resonator (or a device or apparatus comprising it) may, in preferred embodiments, comprise a spring-mass system that include a composite beam 40, 45, or 55. The composite beam shall, in that case, comprise the PCM 10, together with another material 11 or 21. FIGS. 7-9 show cross-sections of composite beams, which may for instance be used in the embodiments of FIG. 1 or 5, as otherwise indicated in FIGS. 1 and 5. In that case, the PCM typically extends along this other material 11 or 21 in a multilayered fashion, to make up the composite beam. In variants, the PCM may be interleaved with or sandwiched in other materials. Note that the phase-change material is preferably protected from oxidation, by means of a protective layer 12. The fixed parts 5, and the composite materials 11 and 21, may use a common MEMS material such as silicon. The protective layer 12 may comprise, e.g., silicon oxide ($SiO_2$). The layer 12 shall typically be insulating (especially when configured as in FIG. 9). Yet, the layer 12 may only cover the top surface of the PCM and therefore be conducting as well (any metal as typically used for electrodes may be used in that case). Referring now to FIG. 10: according to another aspect, the invention can be embodied as a method for tuning a resonance frequency of a spring-mass system of a mechanical resonator (or a device or apparatus comprising it), such as described herein. Basically, such a method revolves around altering S20-S30 a structural arrangement of atoms, ions or molecules (e.g., a phase configuration) of the PCM, in order to tune S20-S50 the resonance frequency to a desired value.

As discussed earlier, altering S20 the phase configuration of the PCM is preferably achieved by way of an electrical circuit, e.g., by Joule heating or by electrically heating a heating element in thermal communication with the PCM. In variants, one may apply Laser pulses to the PCM, as discussed earlier. The PCM is preferably altered in a way so as to be able to change S40 the resonance frequency of the spring-mass system, e.g., by up to 10, 20 or 40%, or even more. More preferably, the PCM may be altered so as to be able to change the frequency by, e.g., at least 1, 10, 20 or 40%, or even more, the exact range depending on a combination of parameters (the materials used, the dimensions of the system parts, the fraction of the spring that is PCM, etc.). The resonance frequency may be monitored, S50, for that purpose, and a feedback loop mechanism implemented, to accurately tune the frequency to the desired value.

To summarize aspects of the present invention, a new mechanical resonator design is proposed, where a PCM is used, so as to be able to more efficiently tune the resonance frequency. The tuning of the resonator may be accomplished by changing a phase configuration of the PCM, e.g., by changing the relative fraction of the crystalline and amorphous phases of the PCM.

A main benefit of such a resonator is that no energy is needed to maintain the tuned frequency, after having tuned it by altering the PCM. Energy is only required to change the phase configuration, the changes in phase are stable and will not require additional energy during operation of the resonator. The resonator can thus be re-tuned many times, again by altering the phase of the PCM, as desired. Also, the tuning range is larger than current solutions (up to approximately one order of magnitude).

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly discussed above in reference to the PCM may be contemplated.

REFERENCE LIST 1, 1a mechanical resonator
5 fixed part of the resonator
7 heating element
10 phase-change material
11 composite beam material
12 protective layer
15 spring part of the spring-mass system
35 spring-mass part
16 electrical circuit portion
17 power supply
20 movable mass of the spring-mass system
21 composite beam material
15, 20 spring-mass system
30 fixed comb
40 coated PCM
45 composite spring beam
50 Laser
55 composite spring beam

What is claimed is:

1. A method for tuning a resonance frequency of a spring-mass system of a mechanical resonator comprising a spring-mass system, wherein the spring-mass system comprises a phase-change material, the method comprising:
   altering, by a first mechanism, a reversibly transformable phase configuration of the phase-change material to tune the resonance frequency; and
   fine-tuning, by a second mechanism distinct from the first mechanism and not affecting the phase configuration, the resonance frequency;
   wherein the second mechanism includes modifying, using a magnetic force, a force-gradient over the motion range of the spring-mass system.

2. A method for tuning a resonance frequency of a spring-mass system of a mechanical resonator comprising a spring-mass system, wherein the spring-mass system comprises a phase-change material, the method comprising:
   altering, by a first mechanism comprising a heater element, a reversibly transformable phase configuration of the phase-change material to tune the resonance frequency; and
   fine-tuning, by a second mechanism distinct from the first mechanism and not affecting the phase configuration, the resonance frequency;
   wherein the second mechanism includes slightly changing the temperature by Joule heating, but not the phase, of the phase-change material.

3. A method for tuning a resonance frequency of a spring-mass system of a mechanical resonator comprising a spring-mass system, wherein the spring-mass system comprises a phase-change material, the method comprising:
   altering, by a first mechanism, a reversibly transformable phase configuration of the phase-change material to tune the resonance frequency; and
   fine-tuning, by a second mechanism distinct from the first mechanism and not affecting the phase configuration, the resonance frequency;
   wherein the second mechanism includes placing the spring-mass system in a larger circuit and tuning the frequency of the larger circuit.

\* \* \* \* \*